(12) United States Patent
Sugiyama (10) Patent No.: US 12,247,788 B2
(45) Date of Patent: Mar. 11, 2025

(54) HEAT-DISSIPATING STRUCTURE

(71) Applicant: NEC Platforms, Ltd., Kawasaki (JP)

(72) Inventor: Kazuma Sugiyama, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 139 days.

(21) Appl. No.: 17/604,488

(22) PCT Filed: Apr. 1, 2020

(86) PCT No.: PCT/JP2020/014988
§ 371 (c)(1),
(2) Date: Oct. 18, 2021

(87) PCT Pub. No.: WO2020/217893
PCT Pub. Date: Oct. 29, 2020

(65) Prior Publication Data
US 2022/0205732 A1    Jun. 30, 2022

(30) Foreign Application Priority Data

Apr. 26, 2019  (JP) .................................. 2019-085315

(51) Int. Cl.
*F28D 15/02* (2006.01)
*F28D 21/00* (2006.01)
(Continued)

(52) U.S. Cl.
CPC .......... *F28D 15/0275* (2013.01); *H05K 5/06* (2013.01); *H05K 7/20* (2013.01); *F28D 2021/0029* (2013.01)

(58) Field of Classification Search
CPC ........ F28D 15/0275; F28D 2021/0029; H05K 5/06; H05K 7/20; H05K 7/20336; F28F 1/32
(Continued)

(56) References Cited

U.S. PATENT DOCUMENTS 4,586,342 A * 5/1986 Morishita .......... H05K 7/20336
62/3.4
5,579,830 A * 12/1996 Giammaruti ............ F28D 20/02
165/104.27
(Continued)

FOREIGN PATENT DOCUMENTS

CN     101702871 A * 5/2010 ......... F28D 15/0275
DE     19647849 A1   6/1997
(Continued)

OTHER PUBLICATIONS

CN 101702871A Machine Translation (Year: 2010).*
(Continued)

*Primary Examiner* — Len Tran
*Assistant Examiner* — Gustavo A Hincapie Serna (57) ABSTRACT

A heat-dissipating structure (1) that can be easily retrofitted to an apparatus that needs to be waterproofed is provided. A heat-dissipating structure (1) includes a first heat-dissipating part (3) configured to receive heat from a heat-generating part (2) disposed inside a housing (8), a rod-like heat-transport member (4), the first heat-dissipating part (3) being disposed at one end thereof, and the heat-transport member (4) being configured to transport the heat from the first heat-dissipating part (3) to the other end of the heat-transport member (4), a second heat-dissipating part (5) including a plurality of fins (5a) arranged in a row at the other end of the heat-transport member (4), and a fixing member (6) disposed between the first heat-dissipating part (3) and the second heat-dissipating part (5), in which a through hole (6a) through which the heat-transport member (4) is passed is formed.

6 Claims, 8 Drawing Sheets

(51) Int. Cl.
*H05K 5/06* (2006.01)
*H05K 7/20* (2006.01)

(58) Field of Classification Search
USPC ........................................................ 165/80.3
See application file for complete search history.

(56) References Cited

U.S. PATENT DOCUMENTS

| | | | | |
|---|---|---|---|---|
| 5,653,284 | A * | 8/1997 | Giammaruti | F28F 1/24 165/162 |
| 6,084,769 | A * | 7/2000 | Moore | G06F 1/203 361/679.52 |
| 6,115,252 | A * | 9/2000 | Ohta | F28D 15/0233 361/689 |
| 7,505,269 | B1 * | 3/2009 | Cosley | F28D 15/0275 165/104.33 |
| 8,233,002 | B2 * | 7/2012 | Nomizo | G03B 21/14 345/531 |
| 10,433,458 | B1 * | 10/2019 | Cader | H05K 7/20336 |
| 10,677,535 | B1 * | 6/2020 | Kawabata | F28D 15/0275 |
| 2004/0070949 | A1 * | 4/2004 | Oikawa | H05K 7/20154 165/104.33 |
| 2007/0039332 | A1 * | 2/2007 | Lee | H04B 1/036 62/3.2 |
| 2010/0027260 | A1 * | 2/2010 | Liu | F21V 29/81 362/373 |
| 2011/0000649 | A1 * | 1/2011 | Joshi | H01L 23/467 165/185 |
| 2013/0153175 | A1 * | 6/2013 | Lin | H05K 7/20318 165/104.26 |
| 2015/0354902 | A1 * | 12/2015 | McDonald | H05K 7/14337 165/45 |
| 2016/0159594 | A1 * | 6/2016 | Shiokawa | B65H 1/04 271/265.01 |
| 2016/0169594 | A1 * | 6/2016 | De Bock | F28F 9/0138 165/80.2 |
| 2016/0268655 | A1 * | 9/2016 | Takamatsu | H01M 10/625 |
| 2016/0352242 | A1 * | 12/2016 | Takabayashi | H02M 7/003 |
| 2016/0353606 | A1 * | 12/2016 | Ryoo | H05K 7/20145 |
| 2017/0330819 | A1 * | 11/2017 | Tao | H01L 23/473 |
| 2018/0042141 | A1 * | 2/2018 | Qu | H05K 7/20745 |
| 2018/0335231 | A1 * | 11/2018 | Gillen | H10N 10/13 |
| 2019/0094295 | A1 * | 3/2019 | Wolff | G01R 31/2874 |
| 2019/0098743 | A1 * | 3/2019 | Molla | H01L 23/3735 |
| 2020/0029460 | A1 * | 1/2020 | Jeong | H05K 7/20145 |
| 2020/0281099 | A1 * | 9/2020 | Klaba | H05K 7/20309 |
| 2020/0375071 | A1 * | 11/2020 | Han | H05K 7/20936 |
| 2020/0400379 | A1 * | 12/2020 | Watanabe | H05K 7/20336 |
| 2020/0400381 | A1 * | 12/2020 | Watanabe | H01L 23/427 |
| 2021/0053825 | A1 * | 2/2021 | Fietzek | C01B 3/04 |
| 2021/0105912 | A1 * | 4/2021 | Takabayashi | H05K 7/20936 |
| 2022/0057144 | A1 * | 2/2022 | Nakashima | H05K 7/20336 |

FOREIGN PATENT DOCUMENTS

| | | | |
|---|---|---|---|
| GB | 2126119 A | | 3/1984 |
| JP | S62-185368 U | | 11/1987 |
| JP | H02-45694 U | | 3/1990 |
| JP | 2005322757 A | * | 11/2005 ......... F28D 15/0266 |
| JP | 2006-308111 A | | 11/2006 |
| JP | 2008-165699 A | | 7/2008 |
| JP | 2018-096613 A | | 6/2018 |

OTHER PUBLICATIONS

Extended European Search Report for EP Application No. 20796335.6, dated on Dec. 9, 2022.

International Search Report for PCT Application No. PCT/JP2020/014988, mailed on Jun. 16, 2020.

* cited by examiner

HEAT-DISSIPATING STRUCTURE

This application is a National Stage Entry of PCT/JP2020/014988 filed on Apr. 1, 2020, which claims priority from Japanese Patent Application 2019-085315 filed on Apr. 26, 2019, the contents of all of which are incorporated herein by reference, in their entirety.

TECHNICAL FIELD

The present invention relates to a heat-dissipating structure.

BACKGROUND ART

A heat-dissipating structure for dissipating heat from a heat-generating part disposed inside a housing of an electronic apparatus or the like has been known. Patent Literature 1 discloses a structure of a heat-dissipating structure including a heat-generating part disposed inside a housing, an air passage which is disposed outside the housing and through which air flows, and a rod-like heat-transport member, such as a heat pipe, connecting the heat-generating part with the air passage. Further, Patent Literature 1 discloses a structure in which a plurality of fins are arranged in a row along a direction in which the heat-transport member extends in a part of the heat-transport member that is located in the air passage.

CITATION LIST

Patent Literature

Patent Literature 1: Japanese Unexamined Patent Application Publication No. 2008-165699

SUMMARY OF INVENTION

Technical Problem

In the case where the structure of a heat-dissipating structure that connects the inside of a housing to the outside thereof through a heat-transport member like the one disclosed in Patent Literature 1 is applied to an apparatus installed outdoors, waterproofing is indispensable. Patent Literature 1 does not mention anything about the application of the disclosed heat-dissipating structure to an outdoor apparatus. When the heat-dissipating structure disclosed in Patent Literature 1 is applied to an outdoor apparatus, it is conceivable to, as waterproofing, fill a gap between a through hole through which the rod-like heat-transport member protrudes from the inside of the housing to the outside thereof and the heat-transport member with a sealant for waterproofing. However, when the heat-dissipating structure is retrofitted to an apparatus installed outdoors, the sealant is injected into the aforementioned gap from the outside of the housing. However, there is a problem that since the gap is very narrow, the sealant does not spread in the gap in a satisfactory manner and hence a sufficient waterproofing property cannot be obtained. That is, it is very difficult to retrofit the heat-dissipating structure disclosed in Patent Literature 1 to an apparatus that needs to be waterproofed.

In view of the above-described problem, an object of the present disclosure is to provide a heat-dissipating structure that can be easily retrofitted to an apparatus that needs to be waterproofed.

Solution to Problem

A heat-dissipating structure according to a first aspect of the present invention includes: a first heat-dissipating part configured to receive heat from a heat-generating part disposed inside a housing; a rod-like heat-transport member, the first heat-dissipating part being disposed at one end thereof, and the heat-transport member being configured to transport the heat from the first heat-dissipating part to the other end of the heat-transport member; a second heat-dissipating part including a plurality of fins arranged in a row at the other end of the heat-transport member; and a fixing member disposed between the first heat-dissipating part and the second heat-dissipating part, in which: a through hole through which the heat-transport member is passed is formed; the fixing member includes a flat surface on a side thereof on which the first heat-dissipating part is located; and a place for disposing a gasket is provided on the flat surface, in which a gap between the heat-transport member and the through hole is filled with a sealant for waterproofing.

Advantageous Effects of Invention

According to the present invention, a heat-dissipating structure can be easily retrofitted to an apparatus that needs to be waterproofed.

DESCRIPTION OF EXAMPLE EMBODIMENTS

Example embodiments according to the present invention will be described hereinafter with reference to the drawings. The following description and the drawings are partially omitted and simplified as appropriate for clarifying the explanation. Further, the same elements are denoted by the same reference numerals (or symbols) throughout the drawings, and redundant descriptions thereof are omitted as appropriate. Note that right-handed XYZ coordinate systems in the drawings are shown for the sake of convenience for explaining positional relationships among components.

First Example Embodiment

Figure 1:
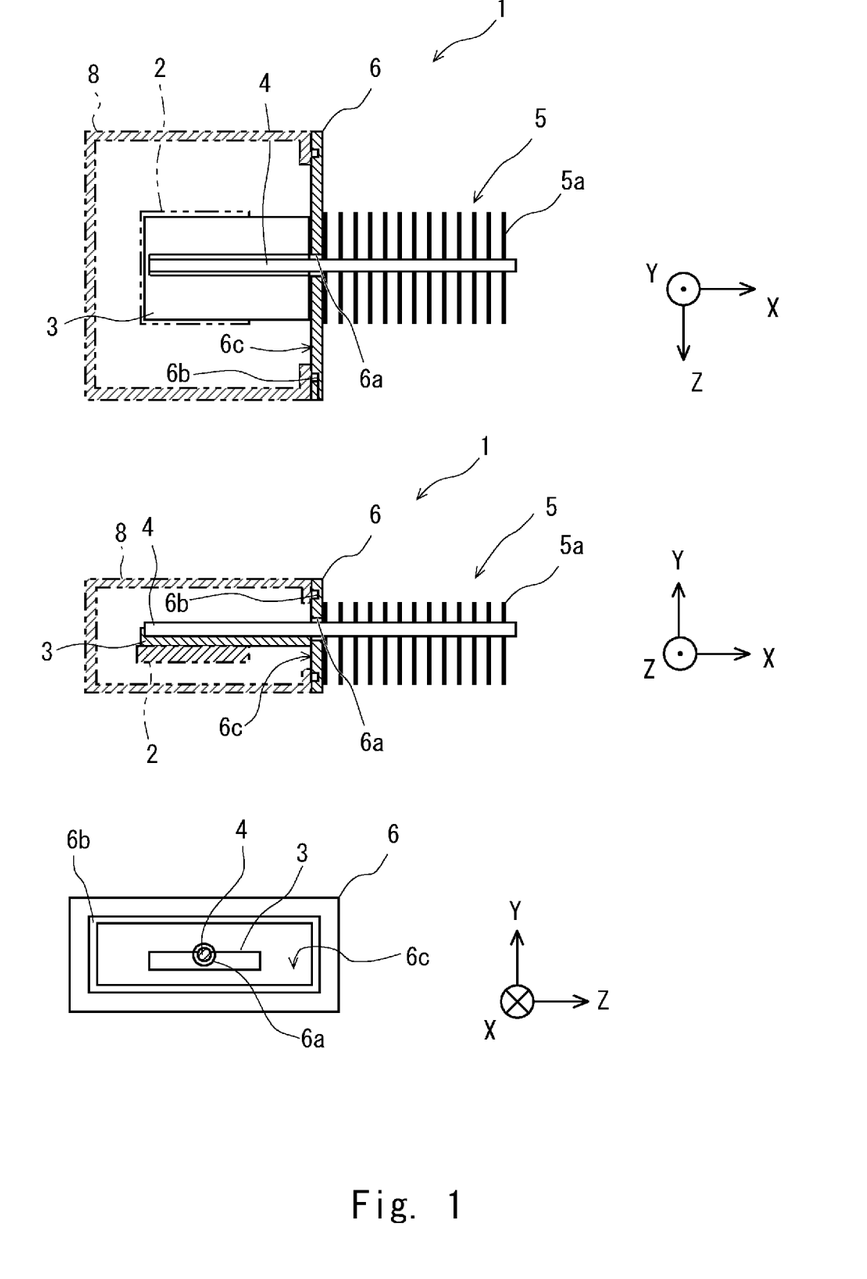
FIG. 1 shows schematic diagrams for explaining a structure of a heat-dissipating structure according to a first example embodiment.

A first example embodiment will be described hereinafter. FIG. 1 shows schematic diagrams for explaining a structure of a heat-dissipating structure 1 according to a first example embodiment. As shown in FIG. 1, the heat-dissipating structure 1 includes a first heat-dissipating part 3, a heat-transport member 4, a second heat-dissipating part 5, and a fixing member 6.

The first heat-dissipating part 3 receives heat from a heat-generating part 2 disposed inside a housing 8. The heat-transport member 4 has a rod-like shape. Further, the first heat-dissipating part 3 is disposed at one end of the heat-transport member 4, and the heat-transport member 4 transports the heat from the first heat-dissipating part 3 to the other end thereof. The second heat-dissipating part 5 is composed of a plurality of fins 5a arranged in a row at the other end of the heat-transport member 4. The fixing member 6 is disposed between the first heat-dissipating part 3 and the second heat-dissipating part 5. A through hole 6a through which the heat-transport member 4 is passed is formed in the fixing member 6. Further, the fixing member 6 has a flat surface 6c on a side thereof on which the first heat-dissipating part 3 is located, and a part 6b for disposing a gasket therein is formed on the flat surface 6c. A gap between the heat-transport member 4 and the through hole 6a is filled with a sealant for waterproofing.

By the above-described configuration, the heat-dissipating structure 1 can be easily retrofitted to an apparatus that needs to be waterproofed.

Second Example Embodiment

A second example embodiment will be described hereinafter.

A heat-dissipating structure according to the second example embodiment is suitable for an electronic apparatus (e.g., a communication apparatus, a power supply, or the like) which is an apparatus installed outdoors and needs to be waterproofed.

Figure 2:
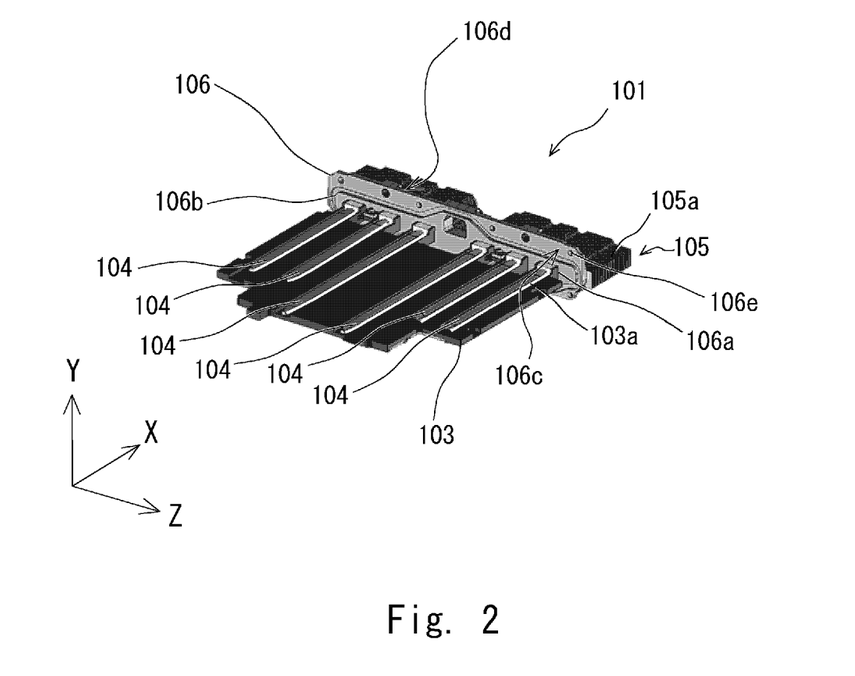
FIG. 2 is a perspective view for explaining a structure of a heat-dissipating structure according to a second example embodiment.
Figure 3:
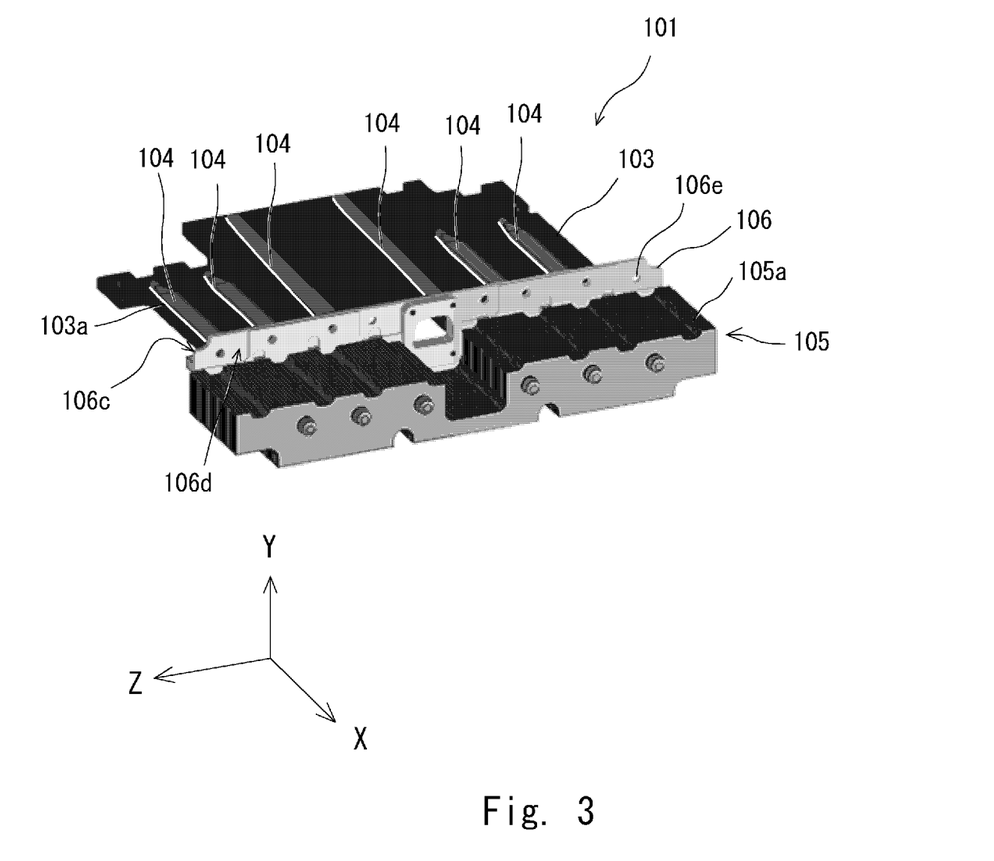
FIG. 3 is a perspective view for explaining the structure of the heat-dissipating structure according to the second example embodiment.

FIGS. 2 and 3 are perspective views for explaining a structure of a heat-dissipating structure 101 according to the second example embodiment. FIG. 2 is a view viewed in a direction from the negative side on the X-axis toward the positive side thereof, and FIG. 3 is a view viewed from the positive side on the X-axis toward the negative side thereof. As shown in FIGS. 2 and 3, the heat-dissipating structure 101 includes a first heat-dissipating part 103, heat-transport members 104, a second heat-dissipating part 105, and a fixing member 106.

The first heat-dissipating part 103 receives heat from a heat-generating part 102 disposed inside a housing 108. The heat-generating part 102 is, for example, a substrate for electronic components. The first heat-dissipating part 103 has a plate-like shape and is formed of a material having a high thermal conductivity such as copper or aluminum. Further, the first heat-dissipating part 103 is brought into contact with the heat-generating part 102 to receive heat from the heat-generating part 102.

The heat-transport member 104 has a rod-like shape. Further, the first heat-dissipating part 103 is disposed at one end of the heat-transport member 104, and the heat-transport member 104 transports the heat from the first heat-dissipating part 103 to the other end thereof. The heat-transport member 104 is, for example, a heat pipe. The heat pipe is an ordinary one that transports heat through a phase change (evaporation/condensation) of a small amount of a hydraulic fluid encapsulated in a pipe-like container. An ordinary heat pipe has the following features: it has very high a thermal conductivity (5,000 to 30,000 W/m·K); no external power is required to make it function; it has a high thermal response; and it has no moving part. Note that the heat-transport members 104 is not limited to the heat pipe, and may be a copper pipe or the like inside which a refrigerant is circulated. The number of heat-transport members 104 is optimized according to the amount of heat generated by a device to be cooled and the surrounding environment.

Parts of the heat-transport members 104 located inside the housing 108 are fitted into fitting groove 103a formed in the surface of the first heat-dissipating part 103. Fixing of the heat-transport members 104 to the first heat-dissipating part 103 is carried out, for example, by soldering. Specifically, the first heat-dissipating part 103 and the heat-transport members 104 with cream solder interposed therebetween are put in a reflow oven. Then, they are heated in the reflow oven, so that the cream solder is melted and the heat-transport members 104 are joined to the first heat-dissipating part 103.

The second heat-dissipating part 105 is composed of a plurality of fins 105a arranged in a row at the other end of the heat-transport members 104. Aluminum is typically selected as a material for the fins 105a, but copper may be selected as the material. Fixing of the fins 105a to the heat-transport member 104 is carried out by soldering, clamping, brazing, or the like.

The fixing member 106 is disposed between the first heat-dissipating part 103 and the second heat-dissipating part 105. Through holes 106a through which the heat-transport members 104 are passed are formed in the fixing member 106. Further, the fixing member 106 has a flat surface 106c on the side thereof on which the first heat-dissipating part 103 is located. That is, the fixing member 106 is a plate-like member, and the through holes 106a penetrate (i.e., extend) from the flat surface 106c on the side on which the first heat-dissipating part 103 is located to a flat surface 106d on the side on which the second heat-dissipating part 105 is located. A groove 106b for disposing an O-ring therein is formed in the flat surface 106c. Further, a plurality of screw insertion holes 106e for screwing the fixing member 106 to the housing are formed in the fixing member 106. The material for the fixing member 106 is a member that can withstand the tightening force of the screws and the reaction force of the O-ring. For example, the material for the fixing member 106 is a metal such as stainless steel or aluminum, or a resin in which carbon or the like is contained to increase its strength.

Figure 4:
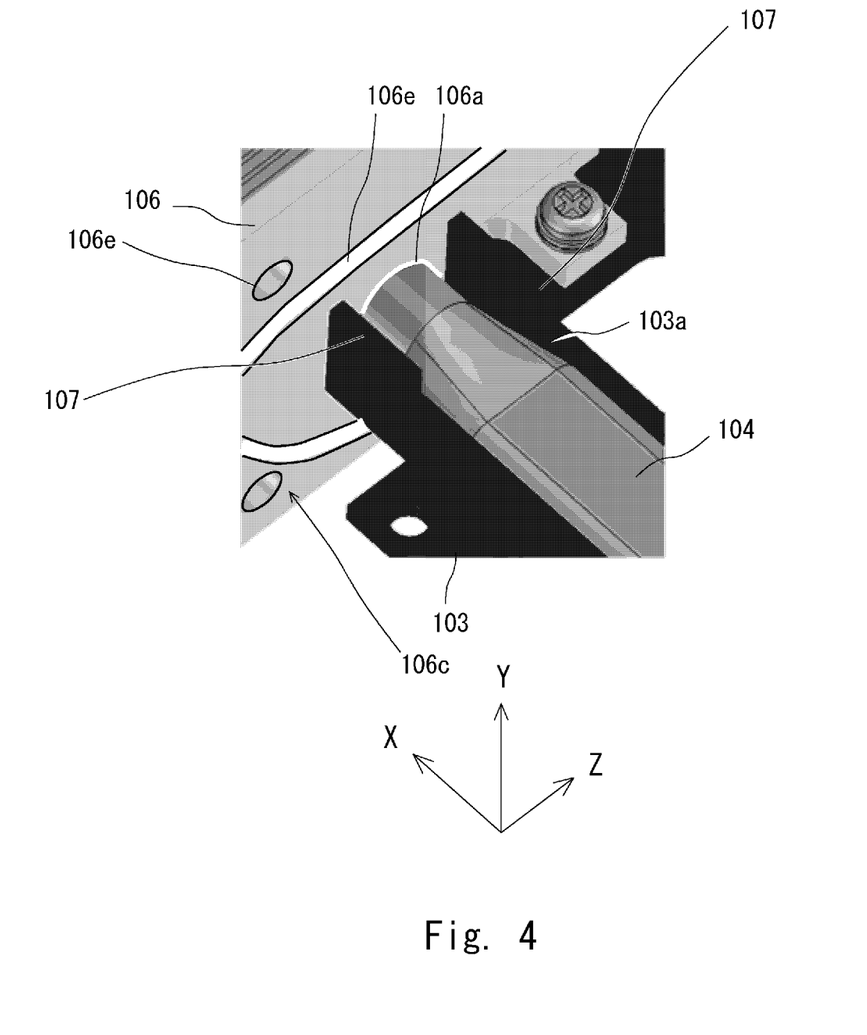
FIG. 4 is a schematic view for explaining a waterproofing treatment applied near a heat-transport member on a flat surface of a fixing member of the heat-dissipating structure according to the second example embodiment.
Figure 5:
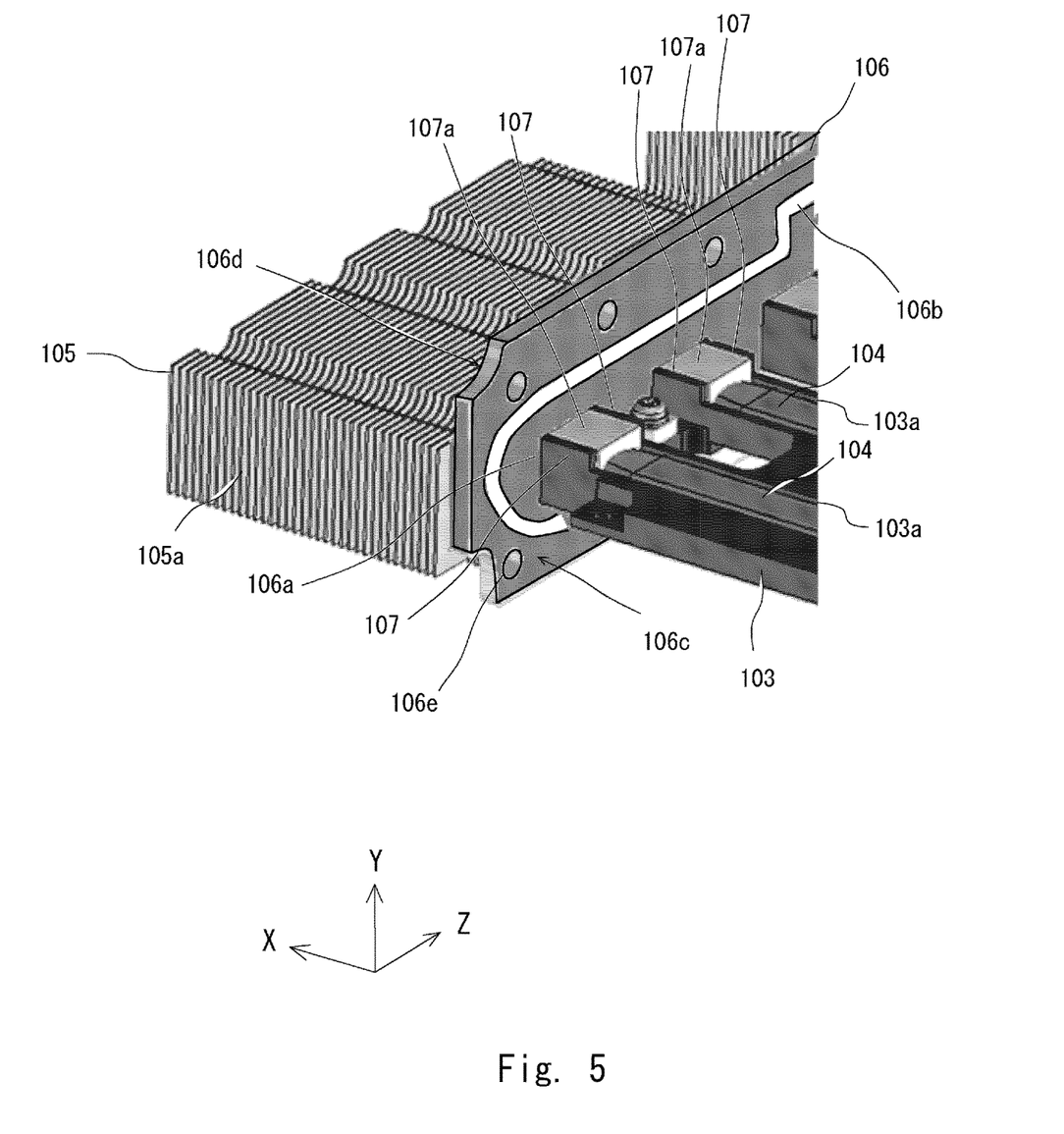
FIG. 5 is a schematic view for explaining the waterproofing treatment applied near the heat-transport member on the flat surface of the fixing member of the heat-dissipating structure according to the second example embodiment.

FIG. 4 and FIG. 5 are schematic views for explaining a waterproofing treatment applied near each of the heat-transport members 104 on the flat surface 106c of the fixing member 106. As shown in FIG. 4, a gap between each of the heat-transport members 104 and a respective one of the through holes 106a is filled with a sealant for waterproofing. Edge parts 107 are vertically formed on both sides of each of the heat-transport members 104 in the vicinity of the fixing member 106 in the fitting groove 103a formed in the first heat-dissipating part 103.

When a sealant is injected into the gap between each of the heat-transport members 104 and a respective one of the through holes 106a as shown in FIG. 4, the sealant leaks out from the gap toward the edge parts 107. Then, as shown in FIG. 5, a part 107a between the edge parts 107, which are vertically formed on both sides of the heat-transport members 104, is also filled with the sealant. Further, the gap between the heat-transport member 104 and the fitting groove 103a is also filled with the sealant. In this way, in the case where the heat-dissipating structure 101 is applied to an apparatus installed outdoors, it is possible to prevent water (e.g., moisture) from entering the inside of the housing 108 through the heat-transport members 104.

Figure 6:
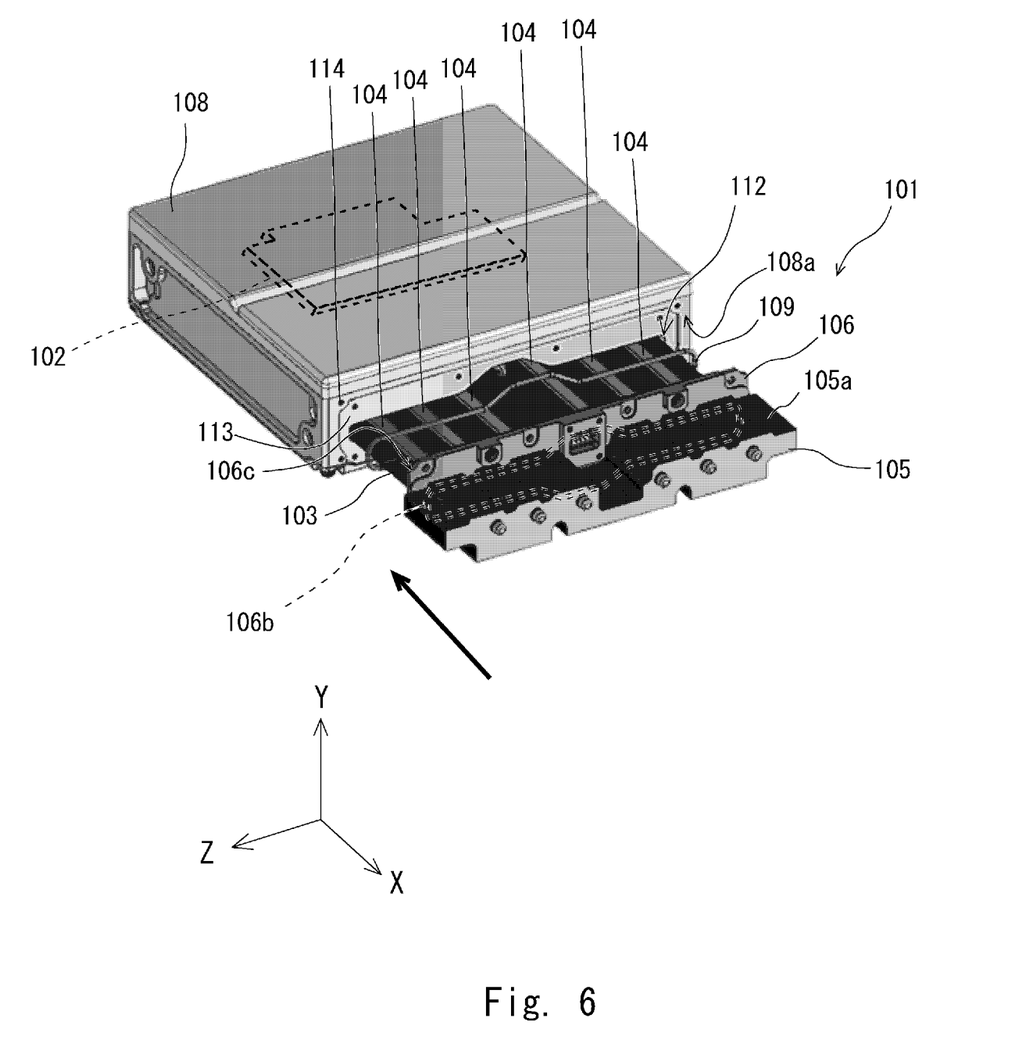
FIG. 6 is a perspective view showing a state in which a heat-dissipating structure according to the second example embodiment is attached to a housing of an apparatus.

FIG. 6 is a perspective view showing a state in which the heat-dissipating structure 101 is attached to the housing 108 of the apparatus. As shown in FIG. 6, the heat-dissipating structure 101 is inserted into an opening 112 formed in a surface 108a of the housing 108. An O-ring 109, which serves as a gasket, is disposed in the groove 106b formed in the flat surface 106c of the fixing member 106 on the side thereof on which the first heat-dissipating part 3 is located. Screw holes are formed, in the surface 108a of the housing 108, at positions corresponding to the screw insertion holes 106e formed in the fixing member 106, and the fixing member 106 is fastened (i.e., fixed) to the flat surface 106c of the housing 108 by screws. The O-ring 109 disposed in the groove 106b of the fixing member 106 abuts on an O-ring surface 113 formed on the flat surface 106c in a state in which the fixing member 106 is screwed to the flat surface 106c of the housing 108. Note that it is sufficient if the O-ring surface 113 has such surface roughness that it prevents water (e.g., moisture) from entering the inside of the housing 108 in the state in which the O-ring surface 113 is in contact with the O-ring 109. As described above, the fixing member 106 is formed of a member that is strong enough so that it can be regarded as a rigid body. Therefore, by fastening the fixing member 106 and the flat surface 106c of the housing 108 with the O-ring 109 interposed therebetween by screws, the water resistance and the weather resistance of the inside of the housing 108 are maintained.

Figure 7:
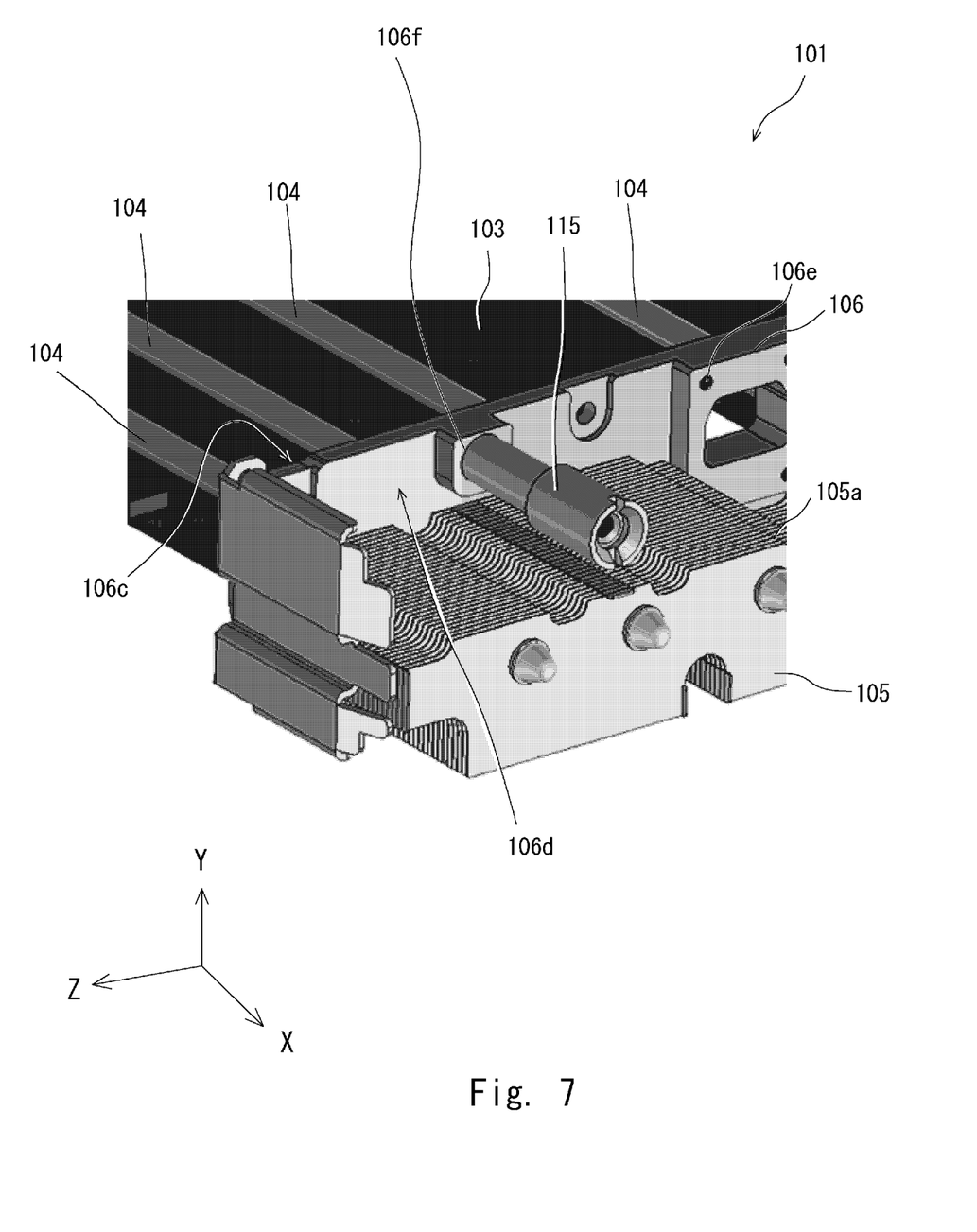
FIG. 7 is a schematic view showing a state in which an extension member is attached to a flat surface of a fixing member of a heat-dissipating structure on the side on which a second heat-dissipating part is disposed according to the second example embodiment in a housing of an apparatus.

FIG. 7 is a schematic view showing a state in which an extension member is attached to the flat surface 106d of the fixing member 106 on the side thereof on which the second heat-dissipating part 105 is located. As shown in FIG. 7, a boss 115 is attached, as ab extension member, to the flat surface 106d. Threads are formed on the tip of the boss 115, so that the boss 115 is screwed into a screw hole 106f formed in the flat surface 106d. By attaching the boss 115 to the flat surface 106d, another component such as a cooling fan can be attached thereto. Further, it is possible to attach, as an extension member, a protective member to the flat surface 106d in order to protect the plurality of fins 105a arranged in the second heat-dissipating part 105 from accidentally-flown small stones, insects, and the like. The protective member is, for example, a net-like plate. In this way, by providing the heat-dissipating structure 101 with the fixing member 106 formed of a member that can withstand the tightening force of screws and the reaction force of the O-ring, it becomes possible to provide the heat-dissipating structure 101 with various expansion members to.

[Problem in Heat-Dissipating Structure According to Comparative Example]

Figure 8:
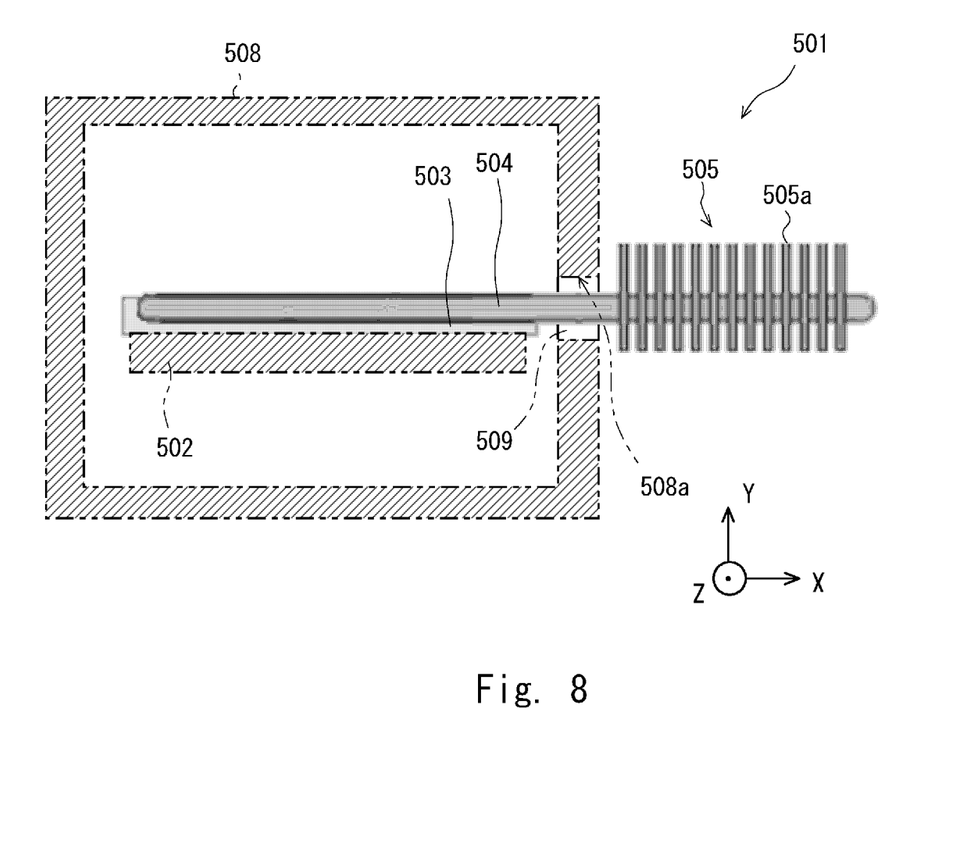
FIG. 8 is a schematic diagram for explaining a waterproofing structure of a heat-dissipating structure according to a comparative example.

Next, a problem in a waterproofing structure of a heat-dissipating structure according to a comparative example will be described. FIG. 8 is a schematic diagram for explaining a waterproofing structure of a heat-dissipating structure 501 according to a comparative example. As shown in FIG. 8, the heat-dissipating structure 501 includes a heat-generating part 502, a first heat-dissipating part 503, a heat-transport member 504, a second heat-dissipating part 505, and a fixing member 506.

In the case where the heat-dissipating structure 501 is retrofitted to an apparatus to be installed outdoors, a through hole 508a is formed in a housing 508, and one end of the heat-transport member 504 at which the first heat-dissipating part 503 is disposed is inserted into a housing 508 from the outside thereof. Further, as a waterproofing treatment, it is necessary to fill a gap 509 between the through hole 508a, through which the rod-like heat-transport member 504 protrudes from the inside of the housing 508 to the outside thereof, and the heat-transport member 504 with a sealant for waterproofing. The sealant is injected into the gap 509 from the outside of the housing 508. However, there is a problem that since the gap 509 is narrow, the sealant does not spread in the gap 509 in a satisfactory manner and hence a sufficient waterproofing property cannot be obtained.

In contrast to the structure according to the comparative example, in each of the structures of the heat-dissipating structures according to the first and second example embodiments, the gap between the heat-transport member and the through hole formed in the fixing member is filled with a sealant for waterproofing before the heat-dissipating structure is attached to the housing. Therefore, it is possible to inject a sealant into the gap from both sides, i.e., the side on which the first heat-dissipating part is located and the side on which the second heat-dissipating part 105 is located, so that the sealant is spread throughout the gap. Further, a groove for disposing an O-ring therein is formed on the flat surface of the fixing member on the side thereof on which the first heat-dissipating part is located, and the fixing member fastened to one surface of the housing by screws. In the case where the heat-dissipating structure is retrofitted to an apparatus installed outdoors, an opening through which one end of the heat-transport member, in which the first heat-dissipating part is disposed, is inserted is formed in the one surface of the housing. The O-ring disposed in the groove of the fixing member 106 abuts on an O-ring surface formed on the one surface of the housing in a state in which the fixing member is screwed to the one surface. In this way, each of the heat-dissipating structures according to the first and second example embodiments can be easily retrofitted to an apparatus that needs to be waterproofed. Since the fixing member is made of a material that can withstand the tightening force of screws and the reaction force of the O-ring, it is possible to, by fastening the fixing member to the one surface of the housing with the O-ring interposed therebetween by screws, maintain the water resistance and the weather resistance of the inside of the housing.

Note that the present invention is not limited to the above-described example embodiments, and they can be modified as appropriate without departing from the scope and spirit of the invention. Further, a plurality of examples described above can be implemented while combining two or more of them with one another as appropriate.

In each of the above-described example embodiments, a structure in which the first heat-dissipating part is in contact with the heat-generating part and receives heat from the heat-generating part through thermal conduction has been described. However, the present invention is not limited to such a structure. For example, the first heat-dissipating part may include a plurality of fins arranged in a row, and may be configured so as to receive heat from the heat-generating part through heat transfer. That is, the first heat-dissipating part may be configured in a manner similar to that for the second heat-dissipating part. In the case where the first heat-dissipating part includes fins, the arrangement of the heat-dissipating structure is more flexible than the case where the first heat-dissipating part 103 is a plate-like member that is brought into contact with the heat-generating part, so that the heat-dissipating structure can be retrofitted to an existing apparatus more easily.

Although the present invention is explained above with reference to embodiments, the present invention is not limited to the above-described embodiments. Various modifications that can be understood by those skilled in the art can be made to the configuration and details of the present invention within the scope of the invention.

This application is based upon and claims the benefit of priority from Japanese patent application No. 2019-085315, filed on Apr. 26, 2019, the disclosure of which is incorporated herein in its entirety by reference.

REFERENCE SIGNS LIST 1, 101 HEAT-DISSIPATING STRUCTURE
2, 102 HEAT-GENERATING PART
3, 103 FIRST HEAT-DISSIPATING PART
4, 104 HEAT TRANSPORT MEMBER
5, 105 SECOND HEAT-DISSIPATING PART
5a, 105a FIN
6, 106 FIXING MEMBER
6a, 106a THROUGH HOLE
6b PART FOR DISPOSING GASKET THEREIN
6c FLAT SURFACE
8, 108 HOUSING
103a FITTING GROOVE
106a THROUGH HOLE
106b GROOVE
106c, 106d FLAT SURFACE
106e SCREW INSERTION HOLE
109 O-RING
112 OPENING
113 O-RING SURFACE
114 SCREW HOLE
115 BOSS

What is claimed is:

1. A heat-dissipating structure comprising:
a first heat-dissipating part for receiving heat from a heat-generating part disposed inside a housing;
at least one rod-like heat-transport member having a first end and a second end, the first heat-dissipating part disposed at the first end thereof, the rod-like heat-transport member configured to transport the heat from the first heat-dissipating part at the first end to the second end;
a second heat-dissipating part comprising a plurality of fins arranged in a row at the second end of the rod-like heat-transport member; and
a fixing member disposed between the first heat-dissipating part and the second heat-dissipating part, the fixing member having at least one through hole through which the at least one rod-like heat-transport member is passed, the fixing member including a flat surface on a side thereof on which the first heat-dissipating part is located, a groove provided on the flat surface, wherein
a gap between the rod-like heat-transport member and the through hole is filled with a sealant,
edge parts are vertically formed on both sides of each of the at least one rod-like heat-transport member in the vicinity of the fixing member, a portion between the edge parts of each of the at least one heat-transport member is filled with the sealant,
an O-ring is disposed in the groove,
parts of the rod-like heat-transport member located inside the housing are fitted into a fitting groove formed by a gap between a surface of the first heat-dissipating part and the rod-like heat-transport member, and
the fitting groove is filled with the sealant.

2. The heat-dissipating structure according to claim 1, wherein each of the at least one rod-like heat-transport member is a heat pipe.

3. The heat-dissipating structure according to claim 1, wherein a second through hole through which the fixing member is screwed to the housing is formed in the fixing member.

4. The heat-dissipating structure according to claim 1, wherein a boss for attaching an air-blowing fan to the fixing member is attached to the fixing member, and threads are formed on a tip of the boss, so that the boss is screwed into a screw hole formed in the flat surface.

5. The heat-dissipating structure according to claim 1, wherein a protective member for protecting the second heat-dissipating part is attached to the fixing member.

6. The heat-dissipating structure according to claim 1, wherein the housing is a housing of an electronic apparatus installed outdoors.

* * * * *